United States Patent [19]

Sarkoezi

[11] Patent Number: 5,111,480
[45] Date of Patent: May 5, 1992

[54] METHOD FOR EQUALIZATION OF THE PULSE WIDTHS OF A DIGITAL SIGNAL

[75] Inventor: Imre Sarkoezi, Munich, Fed. Rep. of Germany

[73] Assignee: Siemens Aktiengesellschaft, Munich, Fed. Rep. of Germany

[21] Appl. No.: 250,149

[22] Filed: Sep. 28, 1988

[30] Foreign Application Priority Data

Sep. 28, 1987 [DE] Fed. Rep. of Germany ....... 3732680

[51] Int. Cl.$^5$ ..................... H04L 25/52; H04L 25/08; H03K 11/00
[52] U.S. Cl. .......................................... 375/4; 375/99; 375/102; 307/265; 328/165; 328/112
[58] Field of Search ..................... 375/4, 102, 104, 94, 375/95, 99; 328/112, 164, 165, 185; 307/234, 268, 265-267; 455/223

[56] References Cited

U.S. PATENT DOCUMENTS

| | | | |
|---|---|---|---|
| 3,387,221 | 6/1988 | Arberman et al. | 328/165 |
| 3,593,162 | 7/1971 | Patmore | 328/165 |
| 3,870,996 | 3/1975 | Miller | 375/102 |
| 4,070,631 | 1/1978 | Nash et al. | 328/165 |
| 4,179,625 | 12/1979 | Carter | 328/112 |
| 4,233,525 | 11/1980 | Takahashi et al. | 307/234 |
| 4,471,235 | 9/1984 | Sakhuja et al. | 328/112 |
| 4,472,814 | 9/1984 | Gutleber | 375/102 |
| 4,554,445 | 11/1985 | Chasse et al. | 235/472 |
| 4,598,412 | 7/1986 | Yoshida | 375/99 |
| 4,757,214 | 7/1988 | Kobayashi | 307/265 |
| 4,841,548 | 6/1989 | Volejnik | 375/110 |

FOREIGN PATENT DOCUMENTS 2037161 6/1971 Fed. Rep. of Germany.
3239936A1 5/1984 Fed. Rep. of Germany.
1278373 6/1972 United Kingdom.

OTHER PUBLICATIONS

Japanese Abstract 56-32824-54-108363, vol. 5, No. 86 (E-60), (758) Jun. 5, 1981.

*Primary Examiner*—Douglas W. Olms
*Assistant Examiner*—Ralph Smith
*Attorney, Agent, or Firm*—Hill, Van Santen, Steadman & Simpson

[57] ABSTRACT

A method and apparatus for equalizing pulse widths of a digital signal. In digital communications transmission systems, the transmitted digital signals are regenerated using line equalizers. Since higher requirements exist for the equalization with digital clock recovery equipment, it is necessary to again equalize the pulse widths. The beginning of the pulses of the equalized digital signal (D3) is obtained from the leading edges of the pulses of the digital signal (D2) which is to be equalized and the end of the pulses of the equalized digital signal (D3) is obtained from the leading edges of the pulses of an auxiliary data clock (DHT). The equipment can be an integrated circuit which has two D-flipflops (22, 23) that alternately process the pulses under the control of a JK-flipflop (26). Digital signals (D2) having a bit rate equal to or greater than 34Mbit/s can also be processed.

9 Claims, 3 Drawing Sheets

METHOD FOR EQUALIZATION OF THE PULSE WIDTHS OF A DIGITAL SIGNAL

BACKGROUND OF THE INVENTION

1. Field of the Invention

This invention relates to method and arrangements for equalizing the pulse widths of spike-free digital signals using an auxiliary data clock and also for the suppressing potentially occurring spikes.

2. Description of Related Art

The following publications show various electronic digital circuits for controlling the pulse widths and other characteristics. U.S. Pat. No. 4,233,525, U.S. Pat. No. 4,554,445, British Patent 1,278,373, Patent Abstracts of Japan Vol. 5, Number 86(E-60) (758) Jun. 5, 1981, German DE 3,239,936 and German 2,037,161.

An auxiliary data clock is available in integrated arrangements for recovery of the clock and/or of the clock phase of a synchronous or plesiochronous digital signal, for example in digital signal multiplex equipment or distributing multiplexers according to an earlier disclosure U.S. Pat. No. 4,841,548. A plurality of such integrated arrangements require only one crystal oscillator. The auxiliary clock pulse DHT can be obtained either from a clock pulse recovery unit which may contain a voltage-controlled oscillator VCO or a local oscillator of a fixed frequency and a phase shifting unit or it may be obtained from the transmitter which transmits it with the data.

Higher demands are made of the tolerances of pulse widths of digital signals which are equalized in line balancers for digital clock recovery equipment than are made for analog clock recovery equipment. It may be necessary therefore to equalize again the pulse widths.

SUMMARY OF THE INVENTION

The object of the invention is to provide a simple method and apparatus for pulse width equalization.

In the method and apparatus for equalization of the pulse widths of a spike-free digital signal with the assistance of the auxiliary data clock. This object is achieved in the invention in that initially the equalized digital signals are derived from the leading edges of the pulses which are to be equalized and the ends of the pulses of the equalized digital signals are derived from the leading edges of the pulses of the auxiliary data clock.

The spike-free digital signal is thus prepared for clocking of its pulses. The pulse widths are always automatically adapted to the presently current phase relationship of the leading edge of the pulses of the auxiliary data clock.

When the digital signals to be equalized contain spikes, then it is advantageous that the pulses of the spike-containing digital signals are delayed and these are AND-operated with the undelayed pulses of the spike-containing digital signal before equalization to form the spike-free digital signal.

A first advantageous arrangement for the implementation of the method comprises a first D-flipflop which is provided with a clock input which serves as an input for the spike-free digital signal, and the Q-output serves as an output for the equalized digital signal and the D-input is connected to an input for a logical high signal "H". A second D-flipflop is provided which has a clock input which serves as an input for the auxiliary data clock and which has a $\overline{Q}$-output which is connected to the reset input of the first D-flipflop, and which has its reset input connected to the Q-output of the first D-flipflop and which has a D-input connected to the input for the logical high signal "H".

A second advantageous arrangement for the implementation of the method comprises a third D-flipflop which has a clock input that serves as an input for the spike-free digital signal and which has a D-input connected to the input for a logical high signal "H". A fourth D-flipflop is provided which has a clock input which serves as the input for the auxiliary data clock and which has a D-input which is connected to the input for the logical high signal "H". A first AND gate is provided which has a first input which is connected to the Q-output of the third D-flipflop and to the reset input of the fourth D-flipflop and which has a second input which is connected to the $\overline{Q}$-output of the fourth D-flipflop and to the reset input of the third D-flipflop and which has an output that serves as the output of the equalized digital signal.

A third arrangement for the implementation of the method comprises a fifth D-flipflop which has a clock input which serves as the input for the spike-free digital signal and which has a Q-output which serves as the output of the equalized digital signal. A sixth D-flipflop is provided which has a clock input which serves as the input for the auxiliary data clock, and which has a D-input connected to the Q-output of the fifth D-flipflop. A first NAND gate has a first input which is connected to the Q-output of the fifth D-flipflop, and a second input is connected to the Q-output of the sixth D-flipflop and it has an output which is connected to the reset inputs of the fifth and sixth D-flipflops.

An advantageous embodiment of the pulse width equalizer of the invention in an integrated circuit comprises a seventh D-flipflop which has a clock input which serves as an input for the spike-free digital signal. An eighth D-flipflop which has a clock input which serves as the input for the spike-free digital signal. A second NAND gate is provided which has its first input connected to the Q-output of the seventh D-flipflop and has a second input which is connected to the Q-output of the eighth D-flipflop and its output serves as the output of the circuit. A JK-flipflop has a clock input which serves as the input for the auxiliary data clock and which has a reset input which serves as the input for a setting signal and which has a J-input which is connected to the $\overline{Q}$-output of the seventh D-flipflop and which has a K-input which is connected to the $\overline{Q}$-output of the eighth D-flipflop. A NOR gate has an inverting, first input which is connected to the input for the setting signal, and has a second input which is connected to the Q-output of the JK-flipflop and which has an output connected to the setting input of the seventh D-flipflop. An inverter is provided which has an input which is connected to the $\overline{Q}$-output of the JK-flipflop and has an output which is connected to the setting input of the eighth D-flipflop. An arrangement for elimination of spikes is formed with a third AND gate which has a first input which is connected to the input for the spike-containing digital signal through a delay element and which has a second input which is directly connected to the input for the spike-containing digital signal and which has an output which serves as the output for the spike-free digital signal.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 2b illustrates plots of pulses for spike suppression according to FIG. 2a;

DESCRIPTION OF THE PREFERRED EMBODIMENTS

Figure 1:
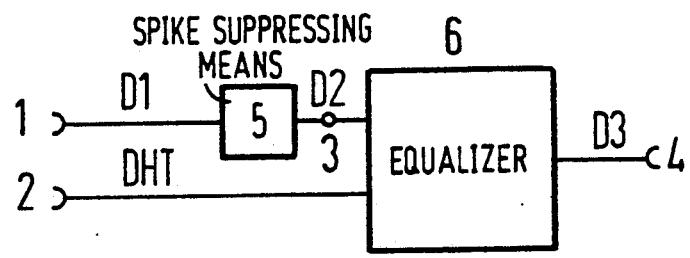
FIG. 1 is a block diagram of a pulse width equalizer with spike suppression.

FIG. 1 illustrates a pulse width equalizer 6 which has a means of preceding spike suppressor 5.

A spike-containing digital signal D1 is supplied to an input 1 and is freed of the spikes by a means of spike supressing means 5. The spike-free digital signal D2 is supplied to a pulse width equalizer 6 at an input 3 and an auxiliary data clock DHT is supplied to equalizer 6 through an input 2. The equalized digital signal D3 occurs at the output 4.

Figure 2A:
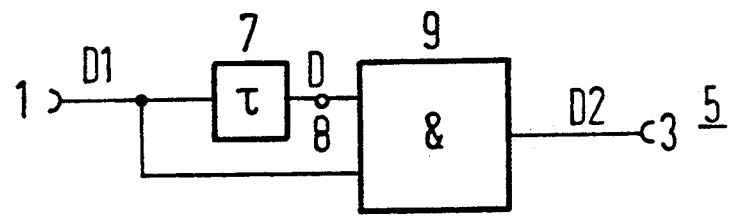
FIG. 2a is a block diagram of a means of spike suppression.

FIG. 2a shows the means of spike suppressor 5 which contains a delay element 7 with a delay time $\tau$ and also contains an AND gate 9 connected as shown.

Figure 2B:
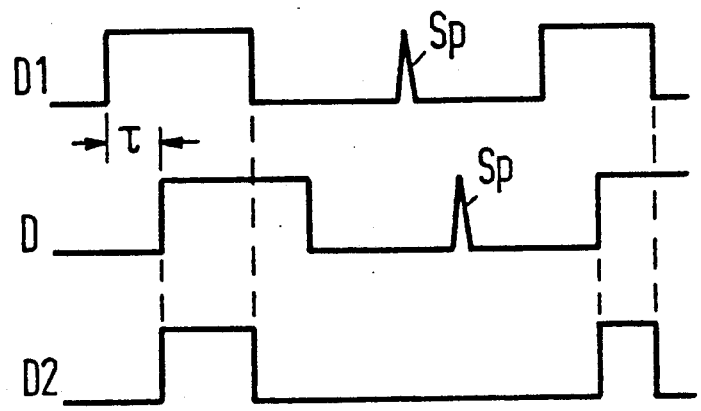

FIG. 2b shows how the spike suppressor 5 operates. A spike-containing digital signal D1 which includes a spike Sp is shown in the top curve. This signal is delayed by the time $\tau$ which is the time that the average pulse D remains in the delay element 7. The digital signal D2 shown in the bottom curve results from an AND operation which confines the digital signals D1 and D. Since the spikes Sp contained in the digital signals D1 and D do not chronologically overlap, they are eliminated by the AND operation. The length of time $\tau$ accordingly, defines the maximum pulse width of spikes which can be suppressed.

Figure 3:
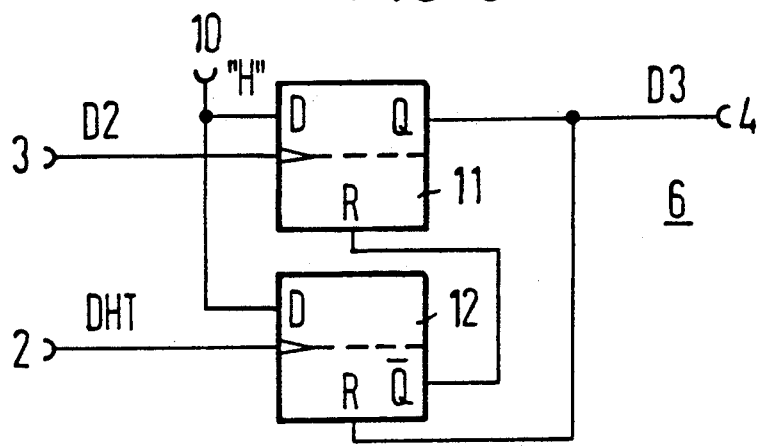
FIG. 3 is a block diagram of a first pulse width equalizer.

FIG. 3 shows a first modification of the pulse width equalizer 6 which contains two D-flipflops 11 and 12 connected as shown. Terminal 3 is connected to flipflop 11 and terminal 2 is connected to flipflop 12. Terminal 4 is connected to the Q output of flipflop 11 and to reset R of flipflop 12.

When a logical low signal "L" is at the output 4, then the D-flipflop 12 is permanently reset and its $\overline{Q}$-output and the reset input of flipflop 11 have the status of logical high signal "H". When the leading edge of a pulse appears at the input 3, then the status of the logical high signal "H" from the D-input is transferred to the Q-output of the D-flipflop 11 and the leading edge of the equalized pulse occurs at the output 4. The reset input of the D-flipflop 12 also assumes the status of logical high signal "H". When the leading edge of a pulse of the auxiliary data clock DHT arrives at the input 2, then the $\overline{Q}$-output of the D-flipflop 12 assumes the status of a logical low signal "L", which is transferred to the reset input of the D-flipflop 11 and causes a transition of the Q-output to a logical low signal "L" and triggers the formation of the trailing edge of the equalized pulse. The reset input of the D-flipflop 12 takes the status of logical low signal "L" and does not react to additional pulses at the input 2.

Figure 4:
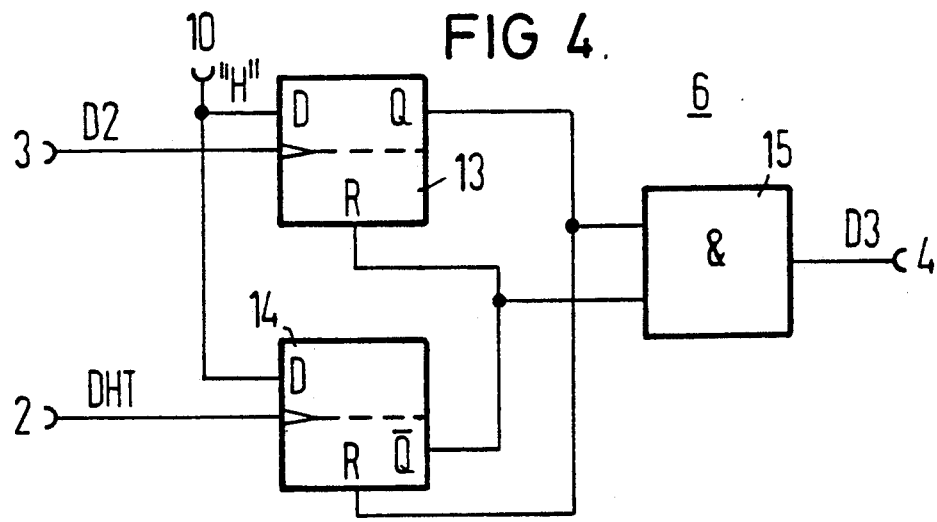
FIG. 4 is a block diagram of a second pulse width equalizer.

FIG. 4 illustrates a second modification of the pulse width equalizer 6 which comprises D-flipflops 13 and 14 and an AND gate 15 connected as shown.

The wiring of the D-flipflops 13 and 14 corresponds to the wiring of the D-flipflops 11 and 12 in FIG. 3. The difference between the two modifications is that the equalized digital signal D3 in FIG. 3 is not taken at the Q-output of the D-flipflop 13 but results from an AND operation between the Q-output and the $\overline{Q}$-output of the D-flipflop 14. This results in that the transit time in the D-flipflop 13 is eliminated in the formation of the trailing edge of the equalized pulses.

Figure 5:
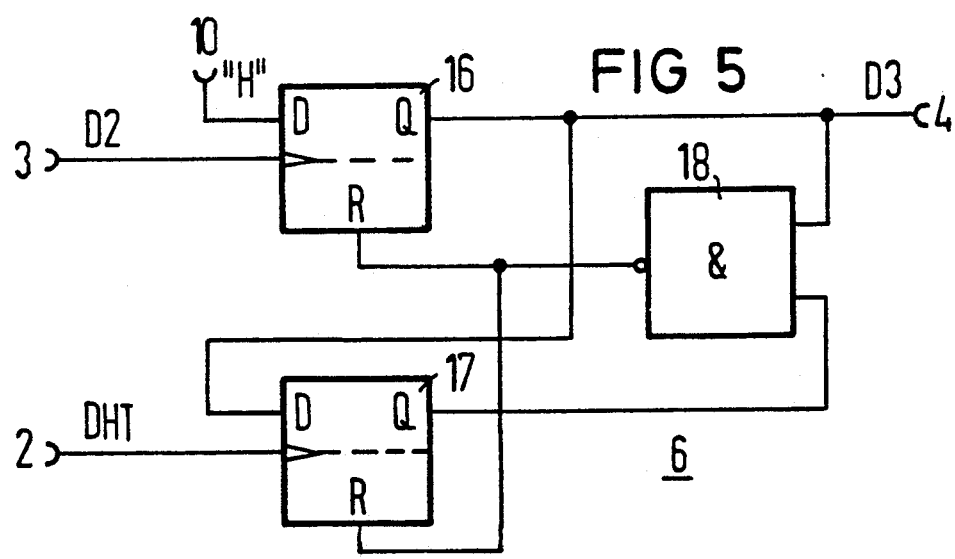
FIG. 5 is a block diagram of a third pulse width equalizer.

FIG. 5 shows a third modification of the pulse width equalizer 6 which comprises D-flipflops 16 and 17 and a NAND gate 18.

When a logical high signal "H" is at the output 4, then this is also true at the D-input of the D-flipflop 17. Until the next leading edge of the auxiliary data clock DHT appears at the input 2, the Q-output of the D-flipflop 17 has a status of logical low signal "L". This results in a status of logical high signal "H" at the output of the NAND gate 18 and at the reset inputs of both D-flipflops 16 and 17. When the leading edge of a pulse then appears at the input 2, the Q-output of the D-flipflop 17 becomes the logical high signal "H", which causes a logical low signal "L" at the reset inputs of both D-flipflops 16 and 17. The Q-outputs of the D-flipflops 16 and 17 go to logical low signal "L" and the trailing edge of the equalized pulse occurs. It is achieved that the internal transit time in the D-flipflop 17 between the Q-outputs and $\overline{Q}$-outputs is eliminated in the formation of the trailing edge of the equalized pulses.

Figure 6A:
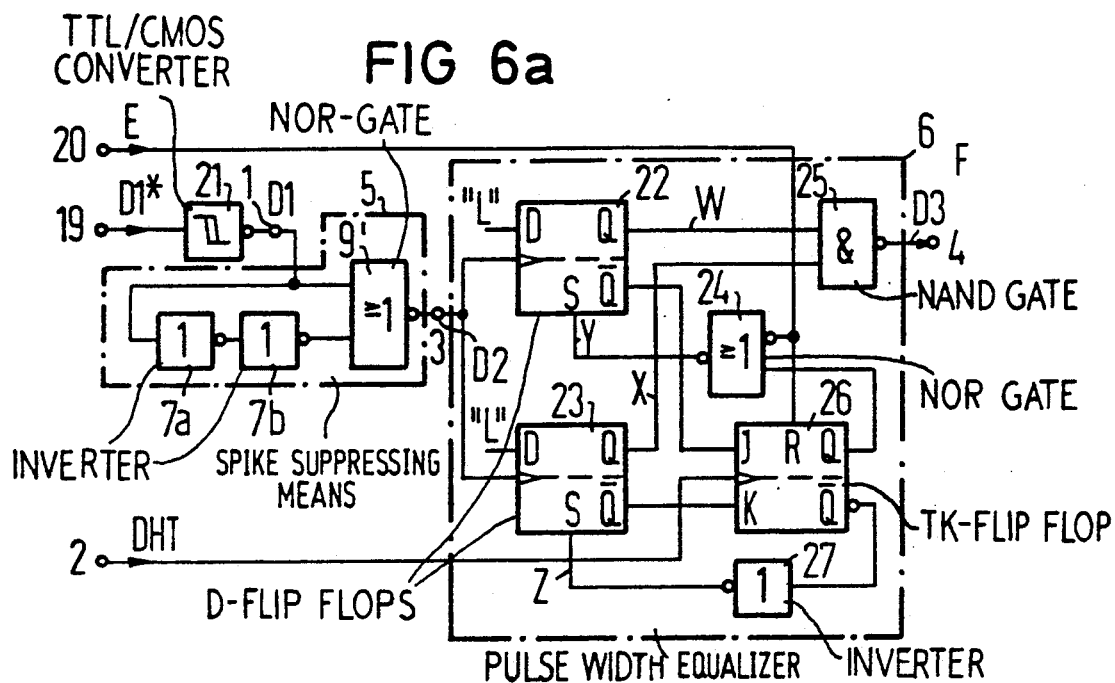
FIG. 6a is a diagram of an integrated pulse width equalizer which has spike suppression.
Figure 6B:
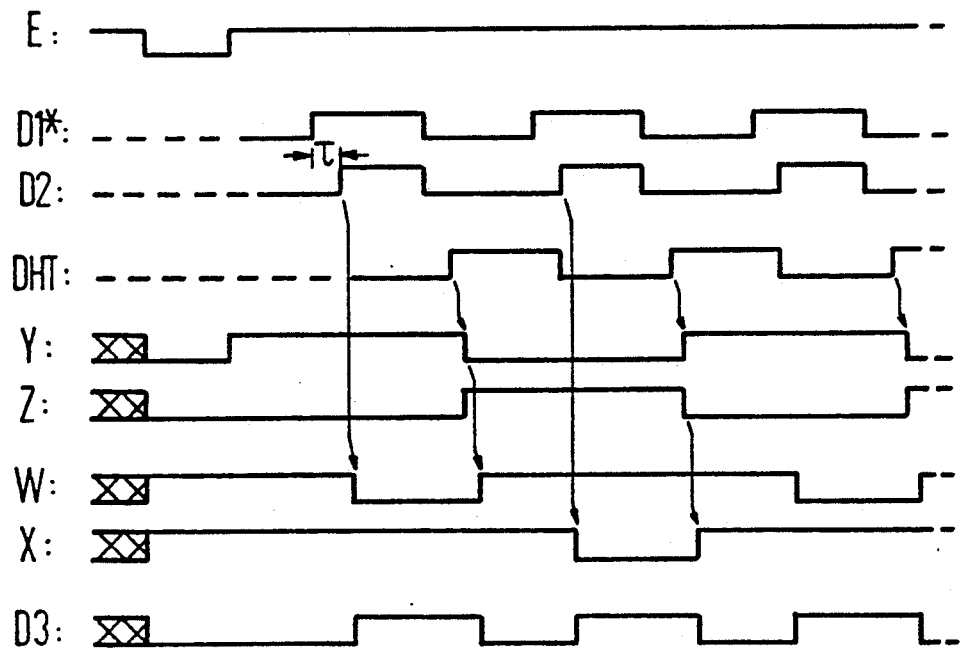
FIG. 6b illustrates time plots of pulses in the integrated pulse width equalizer of the invention.

FIG. 6a shows an integrated circuit in CMOS technology for high bit rates such as 34 Mbit/s which includes a means of spike suppressing 5 and a pulse width equalizer 6; FIG. 6b illustrates pulses occurring in the circuit of FIG. 6.

The means of spike suppressing 5 contains two inverters 7a and 7b which are time delay elements and also contains a NOR gate 9'. The input 1 of the means of spike suppressing 5 is preceded by a TTL/CMOS converter 21 which receives an input 19.

The pulse width equalizer 6 contains D-flipflops 22 and 23, a NOR gate 24 which has an inverting input, a NAND gate 25, a JK-flipflop 26 and an inverter 27 connected as shown.

A spike-containing digital signal D1* adjacent the input 19 is supplied to the input 1 of the means of spike suppressing 5 through the TTL-CMOS converter 21 which has appropriate driver capability. The spikes are suppressed in the means of spike suppressing 5, as set forth with reference to FIG. 2a. The inverters 7a and 7b together produce the delay time $\tau$. The spike-free digital signal D2 is supplied to the input 3 of the pulse width equalizer 6 and the pulses are processed there by the D-flipflops 22 and 23 in alternation. The switching between the two D-flipflops 22 and 23 is controlled by the JK-flipflop 26 which is synchronized with the auxiliary data clock DHT supplied at the input 2. The splitting of the data paths is necessary because the transit times can be excessively large in CMOS technology. This is caused by a number of factors such as temperature, the supply voltage and the components used.

A setting signal E at the input places the D-flipflops 22 and 23 in the status of logical low signal "L" and places the JK-flipflop 26 into its initial condition where it has the logical status low signal "L" at its reset input and places its Q-output into the status of logical low signal "L". As a result thereof, the setting input of the D-flipflop 22 receives a status of logical low signal "L" (Y-pulse) through the NOR gate 24 and the setting input of the D-flipflop 23 also receives a status of logical low signal "L" (Z-pulse) from the $\overline{Q}$-output of the JK-flipflop 26 through the inverter 27. The D-flipflops 22 and 23 are thus set and their Q-outputs receive the status of logical high signal "H" (W-pulse and X pulse). The status at the output 4 of the NAND gate 25 thereby becomes logical low signal "L".

When the setting signal changes to the status of logical high signal "H", the setting input of the D-flipflop 22 receives the status of logical high signal "H" (Y-pulse) and releases the D-flipflop 22 so it can be enabled so as to be synchronously activated by its clock input, whereas the D-flipflop 23 continues to be held in the status of logical low signal "L" (Z-pulse) at the setting input.

As long as the digital signal D2 at the input 3 supplies no pulse, the status at the output 4 is not changed by the auxiliary data clock DHT because the J-input and the K-input of the JK-flipflop 26 remain in the status of logical low signal "L". When, however, a pulse arrives then the logical status low signal "L" is transferred through the clock input from the D-input to the Q-output (W-pulse) and the J-input of the JK-flipflop 26 receives the status of logical high signal "H". The leading edge of the equalized pulse occurs at the output 4 through the NAND gate 25.

The leading edge of a pulse of the auxiliary data clock DHT causes a status of logical high signal "H" to be written in at the J-input of the JK-flipflop 26 by way of the clock input whereupon the Q-output of JK-flipflop 26 changes to logical high signal "H" and the status at the setting input of the D-flipflop 22 (Y-pulse) changes to logical high signal "L" through the NOR gate 24. The D-flipflop 22 is thereby reset and the status at the Q-output (W-pulse) changes back to logical high signal "H" and the trailing edge of the equalized pulse occurs at the output 4 through the NAND gate 25. Simultaneously, the setting input of the D-flipflop 23 receives a status of logical high signal "H" through the inverter 27 and releases the D-flipflop 23 for the next pulse of the digital signal D2, and the D-flipflop 22 is held for such time.

The next pulse is thus equalized by the D-flipflop 23, and its Q-output (X-pulse) and the NAND gate 25, whereby the switching occurs by the K-input of the JK-flipflop 26. This procedure is repeated at the next pulses of the digital signal D2.

The arrows in FIG. 6b show how status changes in a pulse trigger changes other pulses after a certain transit time.

Although the invention has been described with respect to preferred embodiments, it is not to be so limited as changes and modifications can be made which are within the full intended scope of the invention as defined by the appended claims.

I claim as my invention:

1. A method for equalizing pulse widths of a spike-free digital signal (D2) with an auxiliary data clock signal (DHT), comprising the steps of equalization of pulses to obtain an equalized digital signal (D3) by deriving the beginning of the pulses of said equalized digital signal (D3) from the detected leading edges of the pulses of the spike-free digital signal (D2) and deriving the end of the pulses of the equalized digital signal (D3) from the leading edges of the pulses of the auxiliary data clock signal (DHT) to thus obtain the equalized digital signal (D3).

2. A method for equalizing pulse widths of a spike-free digital signal (D2) with an auxiliary data clock signal (DHT), comprising the steps of equalization of pulses to obtain an equalized digital signal (D3) by deriving the beginning of the pulses of said equalized digital signal (D3) from the detected leading edges of the pulses of the spike-free digital signal (D2); and deriving the end of the pulses of the equalized digital signal (D3) from the leading edges of the pulses of the auxiliary data clock signal (DHT), and comprising, delaying the pulses of a spike-containing digital signal (D1) and AND-combining the delayed pulses with undelayed pulses before the equalization so as to form a spike-free digital signal (D2) to thus obtain the equalized digital signal (D3).

3. Apparatus for equalizing pulses comprising a first D-flipflop (11) which receives at its clock input a spike-free digital signal (D2), and which has a Q-output which is the equalized digital signal (D3) and which has its D-input responsive to a logical high signal "H", a second D-flipflop (12) which has its clock input responsive to the input (2) of the auxiliary data clock (DHT) and which has its Q-output responsive to the reset input of said first D-flipflop (11), and its reset input responsive to the Q-output of said first D-flipflop (11) and the D-input of said second D-flipflop responsive to a logical high signal "H" (FIG. 3).

4. An apparatus for equalizing pulses comprising, a first D-flipflop (13) which receives at its clock input a spike-free digital signal (D2) and whose D-input is responsive to a logical high signal "H", a second D-flipflop (14) receives a clock input from the auxiliary data clock (DHT) and has its D-input responsive to a logical high signal "H", a first AND gate (15) which has its first input responsive to the Q-output of said first D-flipflop (13) and responsive to the reset input of said second D-flipflop (14) and which has its second input responsive to a Q-output of said second D-flipflop (14) and responsive to the reset input of said first D-flipflop (13) and which has an output which is the equalized digital signal (3) (FIG. 4).

5. Apparatus for equalizing pulses comprising a first D-flipflop (16) which receives at its clock input a spike-free digital signal (D2) and which has a Q-output which is the equalized digital signal (D3), a second D-flipflop (17) which has its clock input responsive to an auxiliary data clock (DHT), and which has its D-input responsive to the Q-output of said first D-flipflop (16); and a first NAND gate (18) which has a first input responsive to a Q-output of said first D-flipflop (16), and its second input responsive to a Q-output of said second D-flipflop (17) and which has its output connected to the reset inputs of said first and second D-flipflops (16, 17) (FIG. 5).

6. Apparatus for equalizing pulses comprising a first D-flipflop (22) which receives at its clock input a spike-free digital signal (D2); a second D-flipflop (23) which has a clock input that serves as the input (3) for the spike-free digital signal (D2); a first NAND gate (25)

which has a first input responsive to a Q-output of said first D-flipflop (22) and a second input which is responsive to a Q-output of said second D-flipflop (23) and which has an output that serves as the output (4) of the arrangement; a JK-flipflop (26) which has a clock input which serves as the input (2) for the auxiliary data clock (DHT) and has a reset input which serves as the input (20) for a setting signal (E) and which has a J-input which is responsive to a Q-output of said first D-flipflop (22) and has a K-input which is responsive to a Q-output of said second D-flipflop (23); a NOR gate (24) which has its inverting first input responsive to an input (20) for the setting signal (E), and a second input which is responsive to a Q-output of said JK-flipflop (26) and which has an output which is connected to the setting input of said first D-flipflop (22); and an inverter (27) which has its input responsive to a Q-output of said JK-flipflop (26) and which has a input which is connected to the setting input of said second D-flipflop (23) FIG. 6a).

7. Apparatus for equalizing pulses according to claims 3 or 4 or 5 or 6 wherein said apparatus is an integrated circuit formed in CMOS technology.

8. Apparatus for equalizing pulses according to claims 3 or 4 or 5 or 6 for equalizing digital signals (D2) which have a bit rate of equal to or greater than 34 Mbit/s.

9. Apparatus for equalizing pulse to obtain an equalized digital signal (D3) comprising a delay element (7), a first AND gate (9) which has a first input responsive to an input (1) of a spike-containing digital signal (D1) which is received through said delay element (7) and the second input of said first AND gate (9) is directly responsive to said input (1) of the spike-containing digital signal (D1) and said AND gate has an output spike-free digital signal (D2) which has a bit rate of equal to or greater than 34 1 Mbit/s, and an equalizer (6) which receives said spike-free digital signal (D2) and an auxiliary data clock signal (DHT) and produces an equalized digital signal (D3) at its output.

* * * * *